United States Patent [19]

Woods

[11] 4,236,167
[45] Nov. 25, 1980

[54] STEPPED OXIDE, HIGH VOLTAGE MOS TRANSISTOR WITH NEAR INTRINSIC CHANNEL REGIONS OF DIFFERENT DOPING LEVELS

[75] Inventor: Murray H. Woods, Palo Alto, Calif.
[73] Assignee: RCA Corporation, New York, N.Y.
[21] Appl. No.: 875,529
[22] Filed: Feb. 6, 1978
[51] Int. Cl.³ .................................... H01L 29/78
[52] U.S. Cl. .............................. 357/23; 357/41; 357/91
[58] Field of Search ......................... 357/23, 41, 91

[56] References Cited

U.S. PATENT DOCUMENTS

| | | | |
|---|---|---|---|
| 3,339,128 | 8/1967 | Olmstead et al. | 357/23 |
| 3,455,020 | 7/1969 | Dawson et al. | 357/23 |
| 3,719,866 | 3/1973 | Nabor et al. | 357/23 |
| 3,855,610 | 12/1974 | Masuda et al. | 357/23 |
| 4,119,992 | 10/1978 | Ipri et al. | 357/23 |
| 4,132,998 | 1/1979 | Dingwall | 357/23 |

Primary Examiner—Joseph E. Clawson, Jr.
Attorney, Agent, or Firm—Birgit E. Morris; D. S. Cohen; Lawrence P. Benjamin

[57] ABSTRACT

A Metal-Oxide-Semiconductor-Field-Effect-Transistor (MOSFET) is described wherein a body of semiconductor material is provided with source, drain and channel regions and a gate structure located over the interstitial channel portion of the semiconductor body, between the source and drain regions. A stepped or dual thickness oxide layer, having one portion of minimum thickness formed over only a portion of the channel region and another portion of maximum thickness formed over the remaining portion of the channel region. This stepped oxide layer, together with the gate electrode, forms the gate structure. That portion of the channel region covered by the portion of minimum thickness oxide is separated from the drain region, and the portion of maximum thickness oxide is also located over both a portion of the drain region and that portion of the channel region adjacent the drain region.

8 Claims, 3 Drawing Figures

STEPPED OXIDE, HIGH VOLTAGE MOS TRANSISTOR WITH NEAR INTRINSIC CHANNEL REGIONS OF DIFFERENT DOPING LEVELS

This invention relates to semiconductor devices and more specifically to a high voltage, metal-oxide-semiconductor-field-effect-transistor having a stepped oxide region over the channel area.

Metal-Oxide-Semiconductor-Field-Effect-Transistors (MOSFET's) usually consist of spaced drain and source regions of one type of conductivity implanted or diffused into a body of semiconductor material of an opposite conductivity with the intervening space, between the source and drain regions representing the channel region. A gate structure is formed on and insulated from the channel region, and when appropriate voltages are applied to the various elements, major carriers are derived from the source region and flow through the channel region into the drain region.

One problem that has always been apparent in MOSFET devices is the tendency toward zener or avalanche breakdown at the drain-substrate junction at relatively low voltages. This breakdown voltage may be as low as 8-10 volts and therefore limits the use of such a device in an integrated circuit environment where it is desirable and frequently necessary to apply bias voltages considerably in excess of this low breakdown voltage. One attempt by the prior art to correct this defect is discussed in U.S. Pat. No. 3,339,128 which issued to J. A. Olmstead et al. on Aug. 29, 1967. In general, the invention of the Olmstead patent includes a field-effect transistor comprising a channel area and an offset gate spaced from the channel area by insulating material. The insulating material extends over the entire channel area between the source and the drain and has a thick portion positioned over that portion of the channel area adjacent the drain and has a thinner portion positioned over that portion of the channel area adjacent the source. The gate electrode extends over the thinner portion in one embodiment and over both the thin and thick portions in another embodiment.

The Olmstead patent represents an improvement over the prior art devices by reason of the fact that the thicker portion, over the drain region, is believed to displace the surface ions further from the channel whereby the electric field, induced by voltages applied to the gate electrode, will have a lesser influence on any drain current flowing through the channel.

The basic problem with the stepped oxide of the prior art is that the intrinsic or near intrinsic doping of the substrate (necessary to guarantee that the drain voltage field punches through to the channel region under the thin oxide portion of the transistor) dictates a fixed and very low threshold voltage of the transistor.

In accordance with the present invention a MOSFET is described wherein a body of semiconductor material is provided with source and drain regions and an interstitial portion, representing the channel region, therebetween. A gate member, located over the interstitial portion, has a stepped oxide insulating the gate electrode from the interstitial portion.

The stepped oxide, itself, has a first, minimum thickness, portion over and aligned with a portion of the channel region and a second, maximum thickness, portion over the remainder of the channel region and over a portion of the drain region. To establish threshold control of the transistor, it is proposed that the drain region be separated from the channel region while zener or avalanche breakdown be minimized by locating the maximum thickness portion of oxide over both the drain region and the adjacent channel region.

Figure 1:
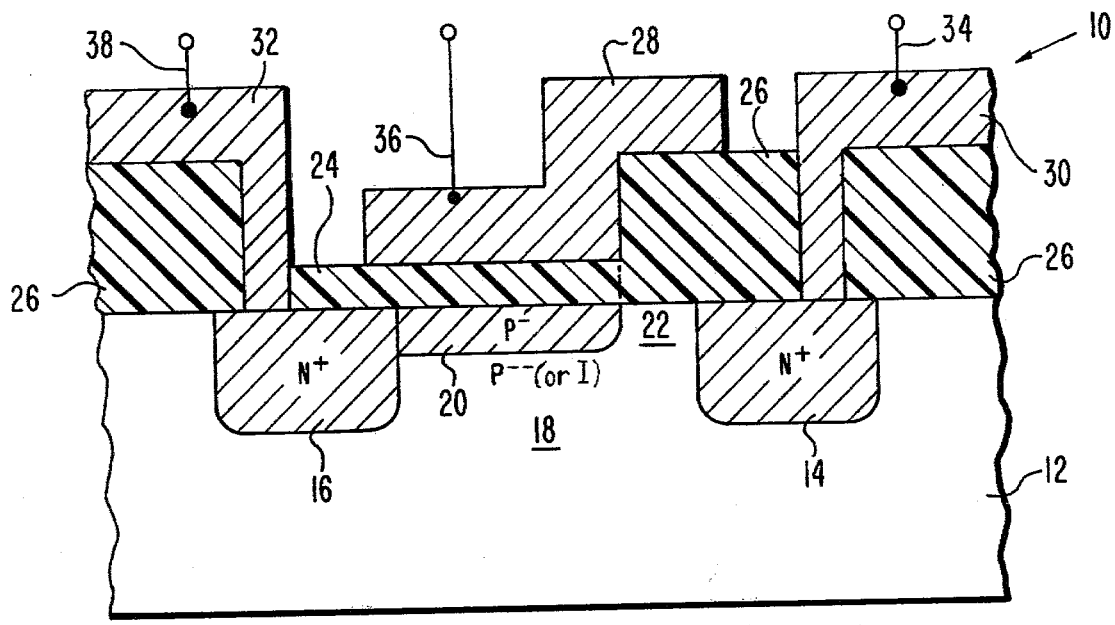
FIG. 1 is a cross-sectional view of one embodiment of a stepped gate oxide MOSFET constructed in accordance with the teachings of the present invention using bulk silicon as the substrate.

Referring now to FIG. 1, there is shown one embodiment of my novel device having its novel gate structure constructed on a wafer 12 of bulk silicon material. As is usual, drain 14 and source 16 are formed at one surface of wafer 12 by any of many well-known ion implantation or diffusion techniques. Drain region 14 and source region 16 are separated by the interstitial portion 18 having a channel or intermediate region 20 and an offset region 22.

It should be understood that while the foregoing exegesis will be presented in terms of an N-channel device, those skilled in the art will recognize that appropriate substitutions of materials may be made herein to derive a P-channel device, without departing from the inventive concept. The following example illustrates the fabrication of the invention where the gate is not self-aligned with the source and drain. The invention can also be embodied in a device configuration featuring self-aligned source and drains. Accordingly, if one starts with bulk silicon material that is either intrinsic or P type material which is near intrinsic, the required N+ drain and source regions 14 and 16 are formed in silicon wafer 12. The practice of my invention requires that region 20 be formed in the interstitial portion 18 with region 20 being to such a degree that the concentration of conductivity modifiers therein is only slightly greater than that present in the offset region 22 of silicon wafer 12. In any event, region 20 is doped doped to any concentration consistent with the channel doping of normal field effect transistors. For example, I have found that this region may be doped to a concentration ranging from between a maximum of $10^{17}$ dopant atoms per cubic centimeter to a minimum of $5 \times 10^{13}$ dopant atoms per cubic centimeter. Portion 22 will remain nearly intrinsic P type and is utilized to separate channel region 20 from drain region 14. Portion 22 may be doped to a concentration ranging from between a maximum of about $10^{14}$ atoms per cubic centimeter to a minimum of about $10^{13}$ dopant atoms per cubic centimeter. Doped region 20 has been found to perform well when doped to a depth of about 1 micron and separated from drain region 14 by a distance of about 1 micron $\pm 0.5$ microns.

An oxide layer is initially thermally grown to a thickness ranging between 600-4000 Å over the entire surface of wafer 12, after which the device is appropriately masked over the portions of maximum thickness 26. The region of minimum thickness gate oxide 24 is attained either (1) by etching the oxide back to the thickness of oxide layer 24 or (2) by etching the oxide down to the bare silicon in this region. At this point, with the photoresist mask still in place over regions 26, region 20 may now be doped by ion implantation, for example, either directly or through the minimum thickness oxide 24. This serves to align the edge of region 20, closest to drain 14, with the edge of the thick oxide portion 26. Thereafter, the photoresist may be removed and, in the event the oxide layer had been removed down to the bare silicon, a minimum thickness gate oxide 24 is grown. Contact holes are then etched through oxide layers 24 and 26 and an appropriate metallization process is carried forth to provide ohmic contacts 28, 30 and 32 to the gate, drain and source electrodes, respectively. The ohmic contacts made to the gate, drain and source regions are shown symbolically at 36, 34 and 38, respectively.

Figure 2:
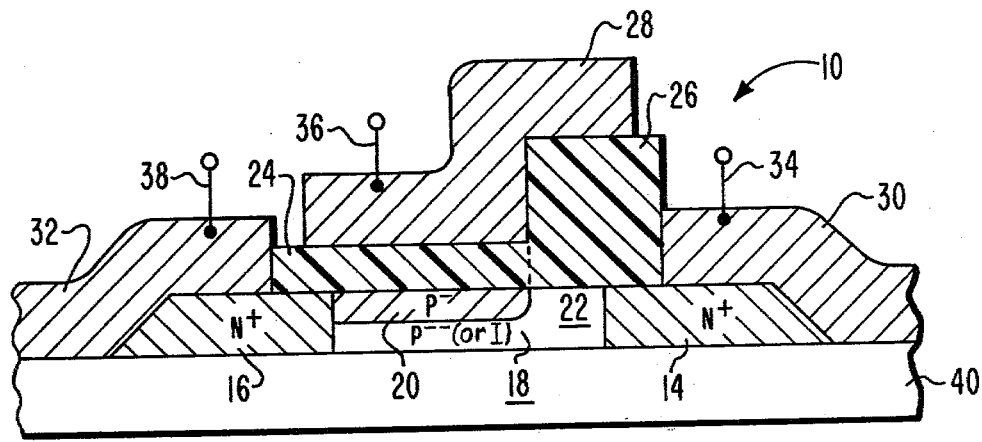
FIG. 2 is a cross-sectional view of a stepped gate oxide constructed in accordance with the teachings of the present invention using an insulative substrate.

Referring now to FIG. 2, there is shown another embodiment of my invention where similar elements are correspondingly numbered to those of FIG. 1. This embodiment, however, details the structure which may be derived using sapphire, spinel or beryllium oxide as an insulative carrier or substrate. In this embodiment one may start with a silicon island consisting of portions 14, 16 and 18 that has been formed on a sapphire carrier and is generically referred to as Silicon-On-Sapphire (SOS). The island may be initially formed of intrinsic or near-intrinsic material and thereafter, by any of the well-known techniques, drain 14 and source 16 are formed, for example, by using a phosphorous dopant to achieve the N+ regions 14 and 16, respectively. Thereafter, to achieve the previously disclosed gate alignment, the thick gate oxide layer is thermally grown to a thickness ranging between 600-4000 Å over the entire surface after which the device is appropriately masked over the portion of maximum oxide thickness 26. The region of minimum gate oxide thickness 24 is obtained in a manner similar to that described in FIG. 1 by either etching the oxide down to form layer 24 and implanting region 22 through layer 24 or by etching the oxide back to the bare silicon, implanting region 20 and subsequently regrowing layer 24. This aligns the edge of region 20, closest drain region 14, with the edge of the thick oxide portion 26. The photoresist may then be removed, contact holes etched in oxide layer 26 and the device appropriately metallized to provide contacts 28, 30 and 32 for the gate, the drain and the source electrodes, respectively. The ohmic contacts made to the gate, drain and source electrodes are shown symbolically at 36, 34 and 38, respectively.

Figure 3:
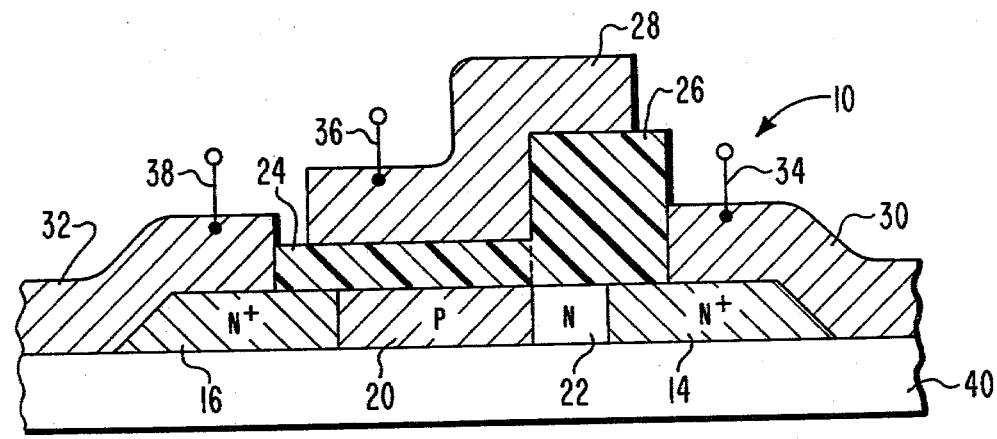
FIG. 3 is a cross-sectional view of another embodiment of a stepped gate oxide device constructed in accordance with the teachings of the present invention utilizing another insulative substrate configuration.

Referring now to FIG. 3, there is shown still another SOS embodiment of my invention wherein one may start by forming an N type island on, for example, sapphire carrier 40. In this embodiment, after the N type island has been formed, it is appropriately masked and N+ regions 14 and 16 are formed to represent the drain and source regions, respectively. The thick oxide region 26 is grown, masked and etched as previously described with respect to FIGS. 1 and 2, and P region 20 is formed by ion implantation as previously described. This produces a device wherein the edge of P region 20 is aligned with the edge of the thick oxide 26 leaving N region 22 as the separation between drain region 14 and channel region 20. Thereafter, the device is completed by forming ohmic contacts 28, 30 and 32 as previously described.

Thus, applicant has presented various embodiments of an improved semiconductor device wherein threshold control is established by providing an aligned, stepped oxide gate structure while zener or avalanche breakdown is minimized by locating a thick oxide layer over the drain-channel junction.

What is claimed is:

1. A field effect transistor comprising:
 a body of near intrinsic semiconductive material of a first conductivity type having a first concentration of conductivity modifiers therein;
 a pair of second conductivity type regions embedded in the semiconductive body, the pair of regions separated in the semiconductive body by an interstitial portion sharing a common boundary surface of the body of semiconductive material;
 an intermediate region of the first conductivity type having a second concentration of conductivity modifiers therein located solely within the interstitial portion and sharing the common boundary surface of the semiconductive body, the intermediate region abutting one of the pair of regions of second conductivity type and spaced from the other of the pair, the concentration of conductivity modifiers present in the intermediate region of the interstitial portion being only slightly greater than the concentration of conductivity modifiers present in the body of near-intrinsic semiconductive material; and
 a layer of insulating material adhered to the boundary layer having a first region of minimum thickness over and aligned with that section of the interstitial portion occupied by the intermediate region and having a second region of maximum thickness over both the remainder of the interstitial portion and a portion of the other of the pair of regions of second conductivity type.

2. The field effect transistor of claim 1, wherein:
 the body of semiconductive material is bulk silicon; and
 the intermediate region is the channel region and is of one conductivity type and the pair of regions are of an opposite conductivity type.

3. The field effect transistor of claim 2, wherein:
 one of the pair of regions is a drain region; and
 the region of maximum thickness of insulating material overlies the remainder of the interstitial portion and a portion of the drain region.

4. The field effect transistor of claim 3, wherein:
 the channel region is doped to a depth of about 1 micron below the common boundary surface; and
 the channel region is spaced about 1 micron 0.5 micron from the drain region.

5. The field effect transistor of claim 1, wherein:
 the body of semiconductive material is an island of silicon formed on an insulative substrate, with the pair of second conductivity type regions, the intermediate region and the interstitial portion located in the island; and
 the insulative substrate is selected from the group consisting of sapphire, spinel and beryllium oxide.

6. The field effect transistor of claim 5, wherein:
 the interstitial portion of the body of semiconductive material is lightly doped silicon of the same conductivity type as the intermediate region; and
 the intermediate region is the channel region and is of one conductivity type and the pair of regions are of an opposite conductivity type.

7. The field effect transistor of claim 6, wherein:
 one of the pair of regions is a drain region; and
 the region of maximum thickness of insulating material overlies the remainder of the interstitial portion and a portion of the drain region.

8. The field effect transistor of claim 7, wherein:
 the channel region is doped to a depth of about 1 micron below the common boundary surface; and
 a spacing of about 1 micron ±0.5 micron is maintained between the channel and drain regions.

* * * * *

UNITED STATES PATENT AND TRADEMARK OFFICE
CERTIFICATE OF CORRECTION

PATENT NO. : 4,236,167

DATED : November 25, 1980

INVENTOR(S): Murray Henderson Woods

It is certified that error appears in the above-identified patent and that said Letters Patent is hereby corrected as shown below:

Column 2, line 41, after "being" insert --doped--.

Column 2, line 44, after "is" delete --doped-- second occurrence.

Column 4, line 42, delete "35" and instead insert --$\pm$--.

Signed and Sealed this

Seventh Day of April 1981

[SEAL]

Attest:

RENE D. TEGTMEYER

Attesting Officer

Acting Commissioner of Patents and Trademarks